United States Patent [19]
Efland et al.

[11] Patent Number: 5,728,594
[45] Date of Patent: Mar. 17, 1998

[54] METHOD OF MAKING A MULTIPLE TRANSISTOR INTEGRATED CIRCUIT WITH THICK COPPER INTERCONNECT

[75] Inventors: Taylor R. Efland, Richardson; David Cotton; Dale J. Skelton, both of Plano, all of Tex.

[73] Assignee: Texas Instruments Incorporated, Dallas, Tex.

[21] Appl. No.: 474,621

[22] Filed: Jun. 7, 1995

Related U.S. Application Data

[62] Division of Ser. No. 333,174, Nov. 2, 1994, abandoned.

[51] Int. Cl.$^6$ ............................................. H01L 21/265
[52] U.S. Cl. ........................... 437/40; 437/41; 437/44; 257/356
[58] Field of Search ................. 437/40 DM, 41 DM, 437/44, 56; 257/335–339, 758, 773, 207, 211, 762

[56] References Cited

U.S. PATENT DOCUMENTS

| | | | |
|---|---|---|---|
| 3,593,068 | 7/1971 | Rosier | 257/762 |
| 4,873,563 | 10/1989 | Daleo | 257/400 |
| 5,060,045 | 10/1991 | Owada et al. | 257/211 |
| 5,060,050 | 10/1991 | Tsuneoka et al. | 257/762 |

FOREIGN PATENT DOCUMENTS

| | | | |
|---|---|---|---|
| 6151730 | 5/1994 | Japan | 257/339 |

*Primary Examiner*—Charles L. Bowers, Jr.
*Assistant Examiner*—Lynne A. Gurley
*Attorney, Agent, or Firm*—Mark E. Courtney; W. James Brady, III; Richard L. Donaldson

[57] ABSTRACT

An interconnection structure and method for a multiple transistor integrated circuit power device is disclosed. A power integrated circuit is formed of a plurality of source and drain diffusion regions to be coupled together to form the source and drain of multiple LDMOS transistors. Each diffusion region has a first metal layer stripe formed over it and in electrical contact with it. A second metal layer conductor is formed over a plurality of the first metal layer stripes, and selectively contacts the first metal layer stripes to form source and drain busses. Polysilicon gate busses are provided as well. A thick third metal layer is then formed over each second metal layer bus, either physically contacting it or selectively electrically contacting it. The thick third level metal is fabricated of a highly conductive material, such as copper. The resulting on resistance for the transistors on the integrated circuit is substantially reduced by the use of the thick third metal layer. Current debiasing and electromigration problems of the prior art are reduced or eliminated. A seven transistor integrated circuit formed from power transistors and incorporating the invention is described. Other devices, systems and methods are also disclosed.

1 Claim, 13 Drawing Sheets

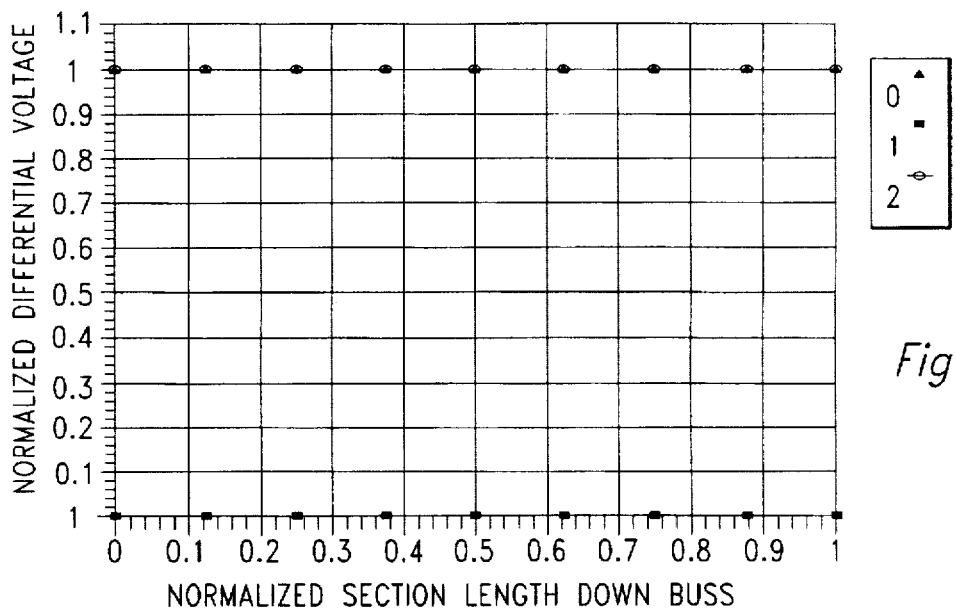
Fig. 8
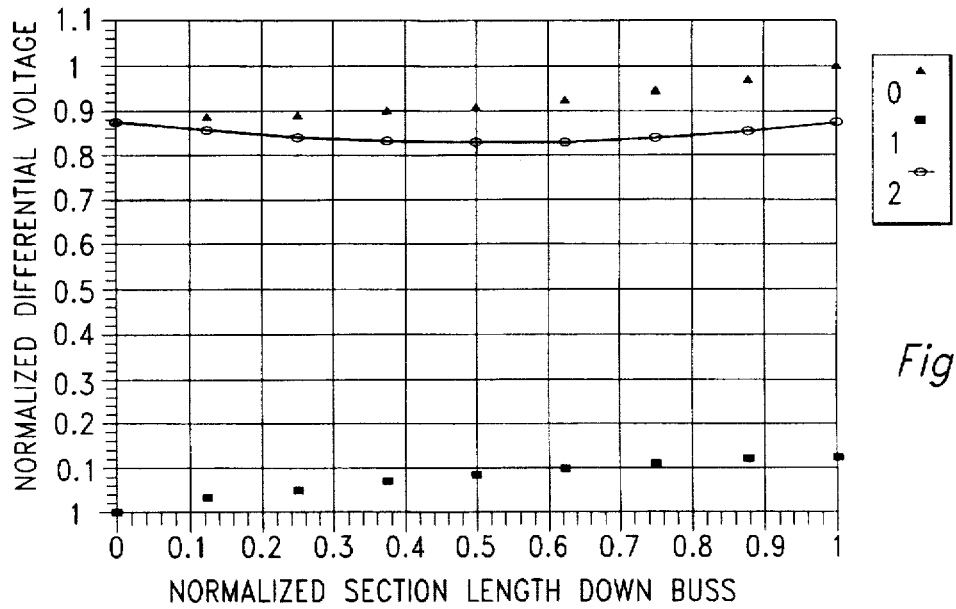
Fig. 9
| OUTPUT DATA | A BANK MOD | B BANK MOD | C BANK MOD | R UNITS |
|---|---|---|---|---|
| R actapp | 0.0641 | 12.8125 | 0.0641 | OHMS |
| R actrl | 0.2626 | 13.0591 | 0.0771 | OHMS |
| R totrl | 0.2626 | 13.0591 | 0.0771 | OHMS |
| %met | 75.60% | 1.89% | 16.89% | |
| %deb | 73.19% | 0.01% | 14.90% | |
| rSp | 0.82 | 0.82 | 0.82 | |
| Rfactor | 0.244 | 0.981 | 0.831 | |
| #stripes | 200 | 1 | 200 | um |
| Met1 | 1 | 1 | 1 | um Al |
| Met2 | 3 | 3 | 3 | um Al |
| MET3 | 0 | 0 | 25 | um Cu |
Fig. 10

5,728,594

METHOD OF MAKING A MULTIPLE TRANSISTOR INTEGRATED CIRCUIT WITH THICK COPPER INTERCONNECT

This is a divisional of application Ser. No. 08/333,174, filed Nov. 2, 1994 now abandoned.

FIELD OF THE INVENTION

This invention relates generally to programmable integrated circuits utilizing lateral double diffused MOS technology, to the fabrication of LDMOS transistors, and specifically to the application of linear geometry lateral DMOS cells and circuits to transistors and integrated circuits for power applications, circuits and systems.

CROSS REFERENCE TO RELATED APPLICATIONS

This application relates to co-pending patent applications:

TI-17968, entitled "Semiconductor Device Having Thick Copper Metallization", filed Aug. 31, 1994, U.S. patent Ser. No. 08/299,177;

TI-16545, entitled "A Method for Current Ballasting and Busing over Active Device Area Using a Multi-Level Conductor Process", filed Mar. 13, 1992, U.S. application Ser. No. 07/850,601;

TI-17846, entitled "LDMOS Transistor with Thick Copper Interconnect", filed Nov. 2, 1994, U.S. patent application Ser. No. 08/333,461; and TI-20031, entitled "An ESD Protection Circuit using LDMOS Diodes with Thick Copper Interconnect", filed Nov. 2, 1994, U.S. patent application Ser. No. 08/333,407, now U.S. Pat. No. 5,468,984; all applications assigned to Texas Instruments Incorporated.

BACKGROUND OF THE INVENTION

In producing integrated circuits for power applications it is typical to use a process utilizing a lateral double diffused MOS (hereinafter LDMOS) technology. Devices are often designed using a plurality of lateral diffusions which are then coupled together to make a single large current capacity device.

In the prior art, single and double level metallization schemes are used to make the connections between the various diffusions and thereby form the large devices required for power circuits. Because the lengths of the metal runs are quite long, current distribution tends to become nonuniform across the devices. As a further consequence, debiasing also occurs along the metal lengths, which means different areas of the device are operating at different potentials. Non-uniform operation of the device results from this metal debiasing and the various diffused areas switch at different instants causing nonuniform current distribution.

Although the conventional two level metallization schemes of the prior art can be optimized to reduce the current debiasing problems, for fabricating large devices carrying large current loads the problems with debiasing remain. One approach to a two metal interconnection scheme for an LDMOS power device composed of many diffusion stripes is described in a co-pending U.S. patent application entitled "A Method for Current Ballasting and Busing over Active Device Area Using a Multi-Level Conductor Process", TI-16545, U.S. application Ser. No. 07/850, 601, assigned to Texas Instruments Incorporated. Although the techniques and structures for placing the contacts and vias in a two level metal interconnection scheme described in this earlier patent application will reduce the debiasing effects as much as possible using conventional metallization techniques, the problems persist for large transistors having long interconnect metal lengths.

In a LDMOS device formed from a plurality of diffusions coupled together using first and second levels of metal, the source and drain diffusions are alternating stripes. The source and drain diffusions are covered with, and in electrical contact with, stripes of the first metal layer, which is typically aluminum having a thickness of up to 1 micron. The first level metal is then covered with an isolation oxide. The second level metal is then used to form source and drain bus lines, each running over many of the source and drain diffusions, and each selectively coupling many of the first level metal stripes to a single bus through the use of contacts cut through the isolation oxide. This second level of metal can have a thickness of up to 3 to 4 microns. This system of interconnect is completely described in the active area bussing patent.

In the prior art LDMOS structures, the second level of metal looks like a resistor in series with the source or drain bond pad and the parallel devices. The mount of resistance provided by the metal interconnection is critical to the performance of the device because the critical parameter for performance, Rdson, is directly proportional to this resistance. For optimal performance of the completed device it is therefore desirable to minimize the metal resistance.

Modeling techniques have shown that for an exemplary LDMOS transistor comprised of 11 paralleled sections, each section having up to 150 diffusion stripes, coupled together using standard 1 micron first level metal and 3 micron aluminum for metal two in a conventional metal system with thicknesses as mentioned, the metal component of the critical Rdson resistance is as great as 63% of the total Rdson. This 63% contribution to the Rdson resistance is from the metal itself and the debiasing effects caused by the metal. Because of the metal resistance a large area of silicon is needed to lower the total Rdson of the device.

Other problems with the conventional methodology are also significant. Because the aluminum metallization scheme provides a somewhat resistive path for the current running along the diffusion stripes, there is an increase in the source voltage as measured from the end closest to the source bus to the other end of the diffusion. In an LDMOS transistor structure, this debiasing effect is of great concern because of the importance of the critical voltage Vgs. As the source voltage increases along the metal run, the voltage Vgs is reduced. As a result, in areas farther from the source pad there is nonuniform operation. As the source potential rises for a given gate voltage Vg, Vgs drops, the transistor segments receive less drive, and the overall device Rdson increases. The non-uniform current distribution due to non-uniform operation of the sections of the LDMOS device also leads to safe operating area problems, in the form of reducing the safe operating area of the device. In a condition where the gate voltage Vg is low, these problems become even greater, and device operation becomes marginal earlier than desired because the effective voltage Vgs is being significantly reduced in regions of high source debiasing. Drain debiasing is a problem also in that the drain potential drops across the device and the available design drive potential is not evenly distributed.

Additional problems arise due to the electromigration current density rules required with conventional metallization systems. Each of the sections of the LDMOS device is covered with a second level bus for the source and another for the drain. These busses are coupled together at the ends of the device. To meet the safe operating requirements using conventional metallization schemes, the busses at the ends of the device have to be made wider and wider as more sections are added, consuming proportionally more and more non-active device area to achieve larger devices.

Further problems arise as higher current capacity devices are designed using the prior art techniques. The nonuniformity of current distribution associated with debiasing can lead to so called "hot spots", areas where localized current exceeds the thermal power limits of the device, and premature failure locations are the result. These premature failures further result in lower peak current capacity ratings for the devices and a reduced safe operating area rating. A need for an improved method for designing lateral power devices which enhances uniform current distribution and device operating efficiency, eliminating current crowding and electromigration concerns, and providing reduced Rdson performance, thus exists.

SUMMARY OF THE INVENTION

Generally, and in one form of the invention, a structure and method for designing a high current capacity IC device with multiple LDMOS power transistors is provided using a lateral DMOS process, the device having a plurality of drain and source diffusions which are rectilinear in shape and laid out in rows. The individual source and drain diffusions are then covered with a first level metal using a conventional metal layer, then a second level of metal is deposited perpendicular to the first level metal fingers. The second level of metal forms source and drain busses which make selective contact to the plurality of source and drain diffusions using vias. A third level of metal is then deposited over the second level metal pattern using a thick conductive layer to form shorting busses. This third level is a low resistance material such as copper and is plated onto the device. The third level of metal is thick enough to greatly reduce the resistance of the metallization pattern and thereby reduce the Rdson resistance of the device. Further, current distribution and debiasing problems are greatly reduced. The need to be concerned with electromigration and current crowding problems in laying out the device is practically eliminated, allowing much more flexibility in design and device placement. The third level of metal is non critical to alignment and acts as very low resistance current busses on the die.

A first advantage of the invention is that the use of the preferred embodiment results in a device with high current carrying capacity and a low Rdson device for a given area, and a greatly improved safe operating area characteristic. A second advantage of the invention is that a given performance requirement can be met in a much lower silicon area, therefore the use of the invention enables the integration of several large power transistors of less than 100 milliohms Rdson into a monolithic device, an arrangement which is not possible using the conventional interconnection techniques. Yet another advantage of the use of the invention is a more uniform Rdson characteristic for LDMOS transistors using the preferred embodiment, which further enhances the performance and safe operating area for devices produced using the invention. Still another advantage is that the use of the preferred embodiment along the gate busses of the device reduces the R-C time constant during switching and reduces the switching loss. The use of the preferred embodiment results in a faster switching time and helps to provide uniform current switching at high operating speeds.

BRIEF DESCRIPTION OF THE DRAWINGS

In the drawings:

FIGS. 7–9 are plots of the debiasing characteristics for LDMOS transistors;

FIG. 10 is a table which presents the Rdson data for the devices shown in FIGS. 1–9;

Corresponding numerals and symbols in the different figures refer to corresponding parts unless otherwise indicated.

DETAILED DESCRIPTION OF PREFERRED EMBODIMENTS

In constructing high power lateral devices using DMOS technology, many lateral drain and source diffusion regions are created and then coupled together. In operation, it has been discovered that the prior art lateral power devices tend to fail primarily due to abnormal nonuniform switching in the long striped geometries used to form the source and drain regions. The nonuniformity of switching appears to occur in part due to the variation in current distribution along the striped source and drain diffusion lengths and the geometry of the metallization of the devices.

In order to describe the operation and advantages of the invention, it will be described in relation to an exemplary transistor implemented using a lateral double diffused RESURF MOS process. This embodiment is intended only to illustrate, and does not limit, the method and structure of the invention, and the advantageous use of the invention is not limited to transistors, or to LDMOS processes. The use of the invention will provide advantages with any process or structure where multiple regions are coupled together to form a single device, including transistors, resistors, diodes, capacitors, or other semiconductor devices.

Figure 1:
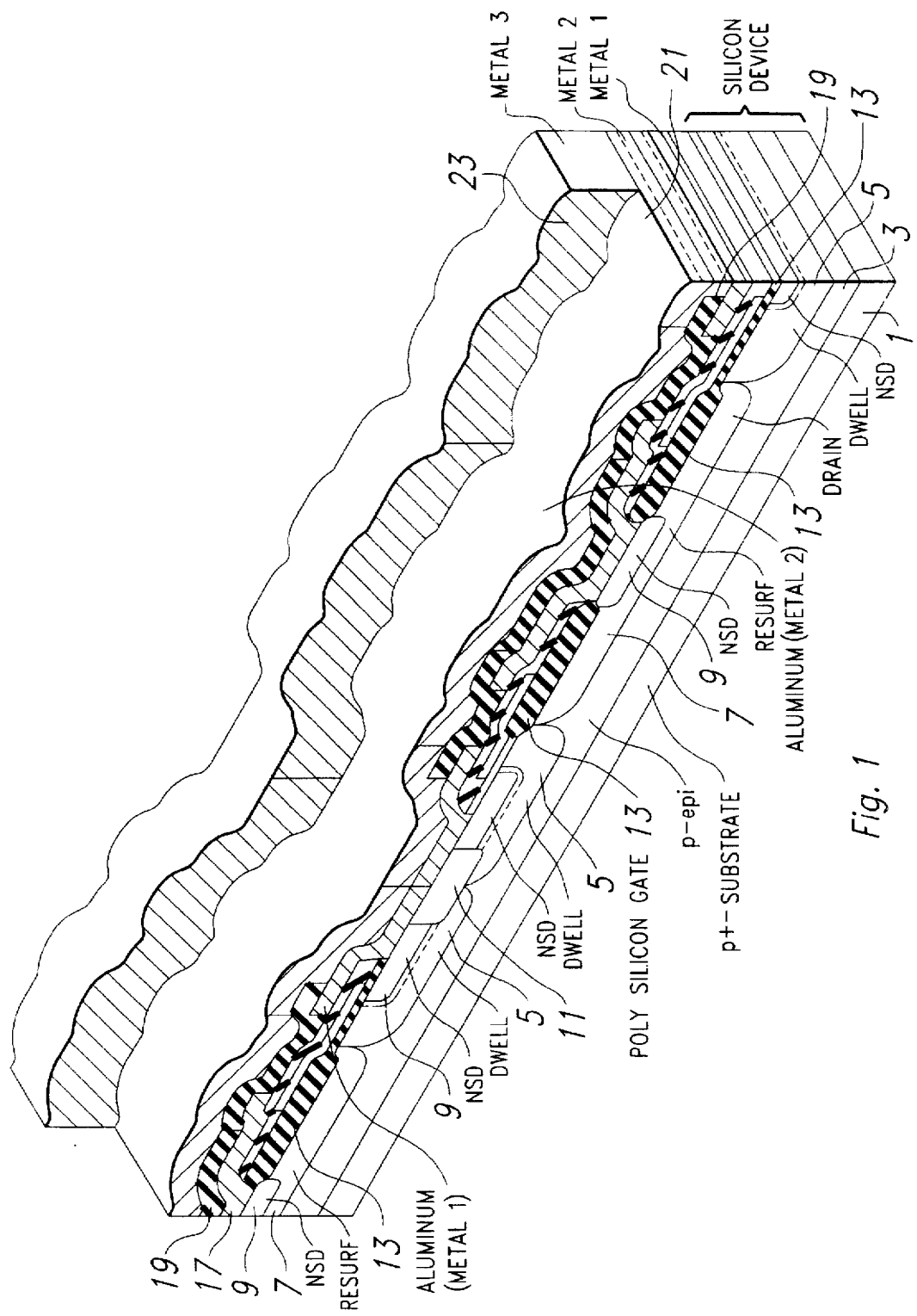
FIG. 1 depicts a source and drain area of a portion of a RESURF LDMOS device, showing the three levels of metallization in cross section.

FIG. 1 depicts a cross section of a lateral DMOS transistor implemented as a lateral device having a plurality of source and drain diffusions with gate oxide and gate polysilicon running between the source and drain striped diffusions. This transistor could be manufactured, for example, using the lateral DMOS process as described in U.S. Pat. No. 5,272,098, entitled "Vertical and Lateral Insulated Gate Field Effect Transistors, Systems and Methods", assigned to Texas Instruments Incorporated, and herein incorporated by reference. Alternatively, the methods of U.S. Pat. No. 5,242, 841, entitled "Method of Making LDMOS Transistor with Self-Aligned Source/Backgate and Photo-Aligned Gate", assigned to Texas Instruments Incorporated and herein incorporated by reference, may be used. U.S. Pat. No. 5,306,652, entitled "Lateral Double Diffused Insulated Gate Field Effect Transistor and Fabrication Process", and also assigned to Texas Instruments Incorporated and herein incorporated by reference describes the manufacturing of LDMOS transistors and more specifically reduced surface field effect (RESURF) transistors. Other methods of manufacture of lateral devices could be used as well.

FIG. 1 depicts a three dimensional view of a portion of the finished transistor. Silicon substrate 1 is shown with an epitaxial layer 3 deposited over the substrate. A p type diffusion well 5 is formed using a dopant implant and a diffusion step. Polysilicon gate 15 is deposited to complete the gate formation for the transistor. Source and drain regions 9 are formed using a second dopant implant, as is backgate contacting region 11, which is the same conductivity type as the diffusion well, but a heavier concentration. The backgate and source and drain regions are then completed using a second diffusion step. These implants are done using the gate polysilicon 15 in conjunction with the drain LOCOS region 13 as a mask, so that the gate and source and drain regions are self aligning. Isolation oxide is formed over the gate and gate oxide regions. A pattern and oxide etch is applied to create the contacting regions in regions 9 and 11 for connecting the metallization layers to the silicon surface. A first metallization layer 17 is deposited and patterned to contact with the source and backgate regions, and also in contact with the drain regions. These first metal regions are electrically isolated, that is they follow the source and drain regions and are not coupled together.

A second isolation oxide 19 is deposited over the first metallization layer. Vias are patterned and etched in this second isolation oxide in places where the first and second metallization layers are to be interconnected. A second metallization layer 21 is then deposited to complete the structure. This second layer is used to selectively interconnect multiple source or drain diffusion regions to form large source and drain areas for the transistor. The third level metal 23 is then deposited by electroplating over the second metallization layer 21. In this first embodiment, the second and third level metallization layers are shown as being in physical and electrical contact. However, in other regions, a protective overcoat is placed over the second metallization layer, and this protective overcoat is patterned and etched so that the third metallization layer is electrically isolated from the other levels. Vias can again be used to couple the third level of metal to the second level to reduce the debiasing effects of the first two level metallization structure.

Figure 2:
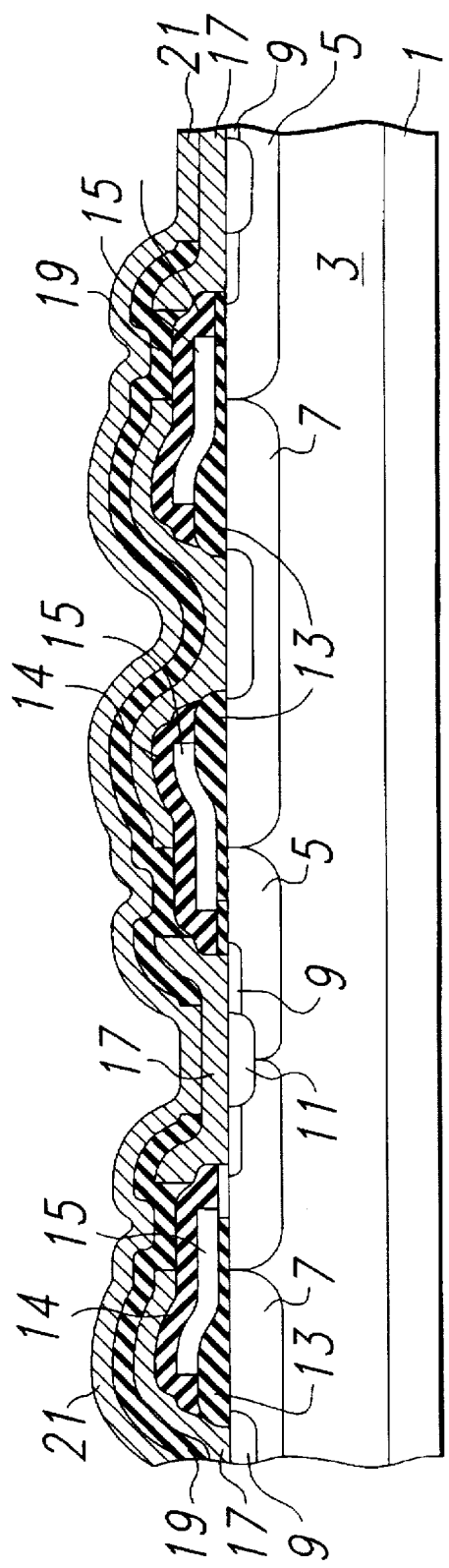
FIGS. 2–4 depict the steps used to build the cross section of the device of FIG. 1.
Figure 3:
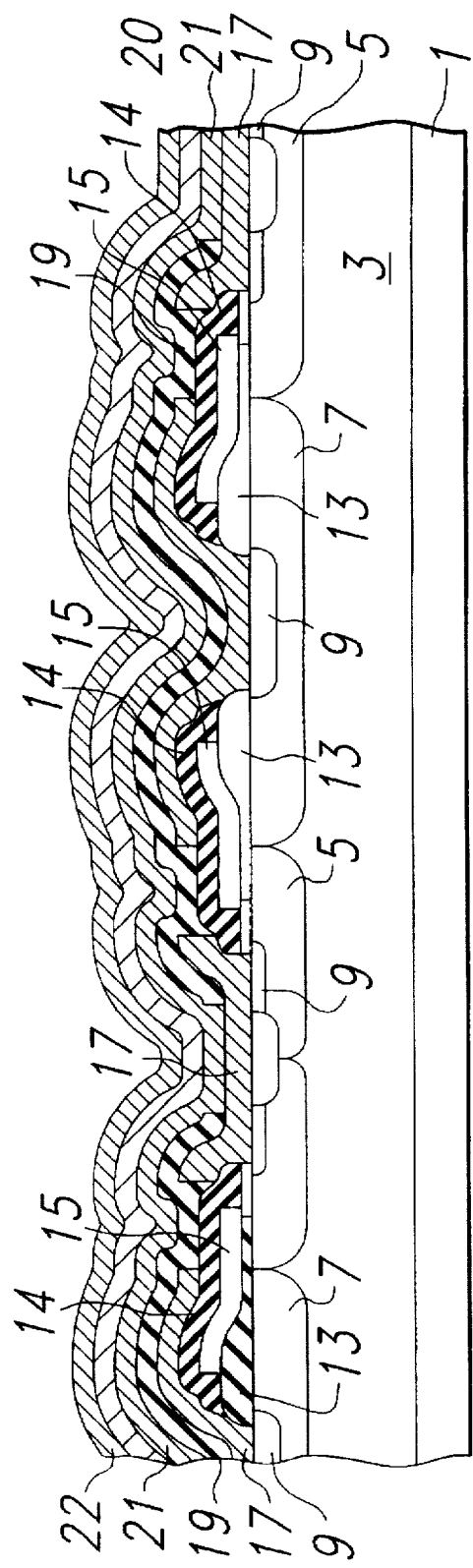
Figure 4:
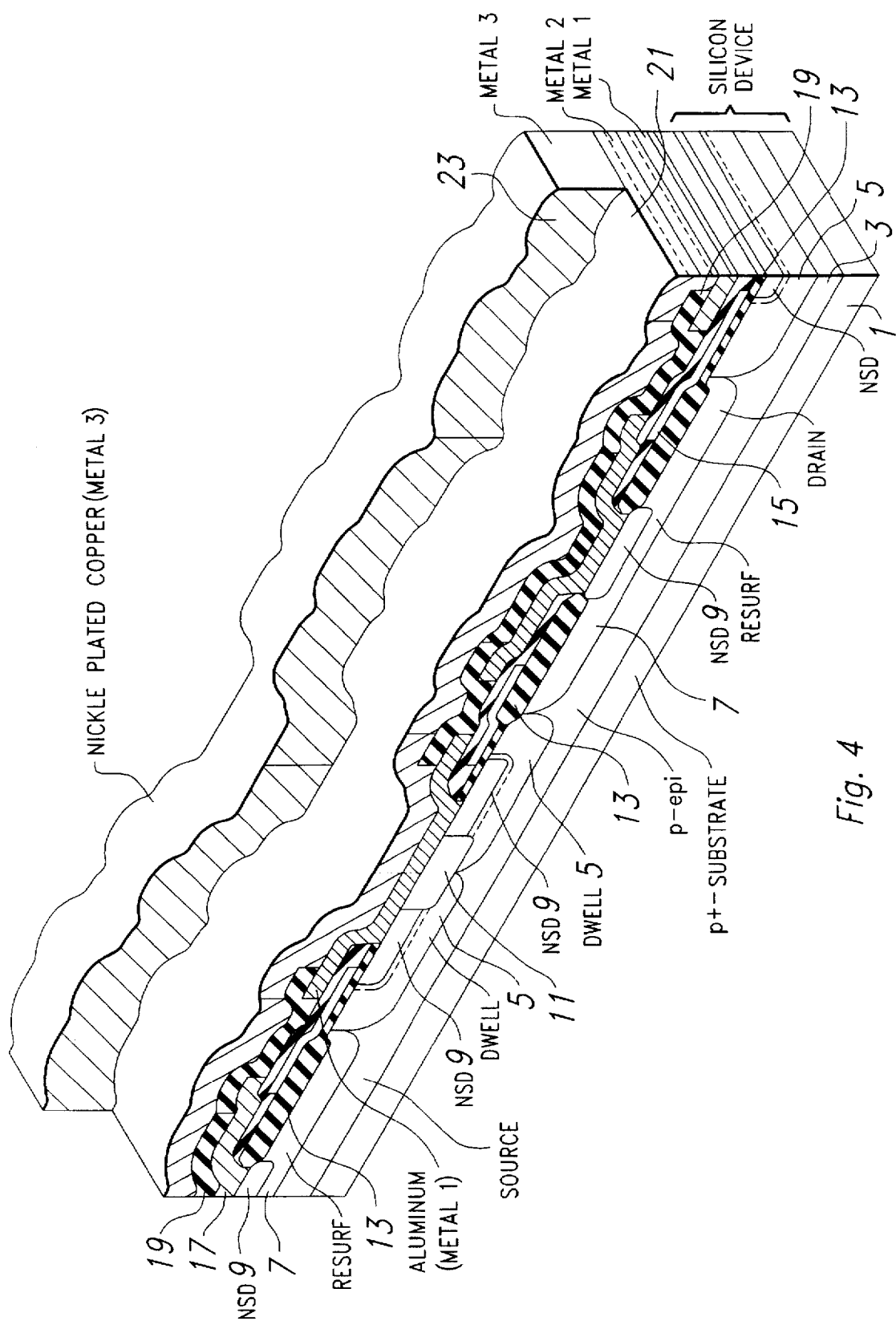

FIGS. 2-4 depict in cross section the process steps used to fabricate the transistor of FIG. 1. Source and drain regions are formed using the steps as described in the patents as incorporated herein above. In FIG. 2, the p type substrate is shown after a p type epitaxial layer 3 is formed overlying it. Epitaxial layer 3 may be formed by using well known chemical vapor deposition techniques, molecular beam epitaxy or ion implantation. Since in this application the epitaxial and substrate layers are of p type, boron is used as the dopant during the formation of layer 3. The gate oxide 13 and the polysilicon gates 15 are formed. The source and drain contacting regions 9, along with the body contacting regions 11, are formed to contact the diffusion well 5 for the source, and resurf area 7 for the drain. The gate isolation oxide 14 is a thin oxide which is deposited then patterned and etched to leave the drain and source regions 9 and the backgate diffusions 11 exposed to receive the first layer of metallization in electrical contact. The first metal 17 layer is deposited to contact the source and drain diffusions 9 and the backgate diffusions 11. The first metal layer 17 may be fabricated using well known metallization systems, such as aluminum, or a barrier metal and aluminum, and is formed using LPCVD techniques. The first metal layer 17 has a thickness in the range of approximately 1 micron. Then, the second metallization layer 21 is formed. This layer selectively couples first metal which is in contact with either source or drain diffusions. An isolation oxide 19 is formed over the entire substrate. This oxide is then patterned to expose the areas of the first metal layer 17 that are to be coupled to the second metal layer. The second metal layer 21 is then deposited and patterned over the substrate forming columns of source or drain striped regions that are coupled together by the vias in oxide 19. Second metal layer 21 is formed over the oxide 19 and fills the vias to couple the second metal 21 to first metal layer 17, the second metal layer being formed using the same technique as that used for the first metal layer, and being of a conventional material, such as aluminum with a maximum thickness in the range of 3-4 microns. This maximum is determined by the capability of the conventional processing techniques.

FIG. 3 depicts the first steps used in fabricating the third level copper layer of the preferred embodiment. After the second metal layer 21 is patterned a protective overcoat is applied to the wafer in the form of a deposited nitride layer as commonly used in semiconductor processing. The next step is a patterning step which opens exposes the regions of metal two in the bond pad locations. A via pattern is also applied which sets up vias to make contact between the third level metallization layer, not yet formed, and the metal two layer 21. A barrier layer 20 of Ti-W is deposited over the entire substrate, protecting the second metal layer 21 and the underlying layers. This layer typically 1000 Angstroms thick. A seed layer 22 for a metal plating operation is then deposited onto the barrier layer. This seed layer will be of the same type of material as the final third level metal layer, and in a preferred embodiment it will be of copper or copper alloy. This layer must be sufficiently thick to support a plating operation, and is typically 2000 Angstroms thick. Other useful alternative materials for the third layer include other superior conducting materials such as gold, however copper is a better conductor and therefore preferred over gold, and is also an inexpensive material.

FIG. 4 depicts the completed structure, and repeats FIG. 1. To complete the device, a thick layer of copper is plated over the seed layer 22 using an electroplating or electroless technique. The thick layer of copper 23 is patterned using a negative photoresist mask, that is a thick layer of photoresist is patterned and etched such that photoresist remains only where the thick metal three layer is not desired, then the copper is plated using an electroplating technique on the seed layer, and the resulting copper bus is plated up to the height of the thick photoresist or less if desired. Typically, the copper layer will be plated to a thickness of 15-35 microns. In order to prevent problems at the top of the plated structure, the photoresist layer must be thicker than the final copper layer. Thicker copper structures can be plated on for even lower resistivity. The photoresist and the seed layer under the photoresist are then stripped from the areas where no copper is plated using conventional processing techniques. The barrier layer of Ti-W protects the bond pad areas where the third level of metal is not desired from getting etched away while the copper seed layer is removed. The Ti-W layer is then removed using a selective etch. Finally, a plating step of an inert material is performed on the copper third level metal layer 23 using an electro or electroless plating process. In a preferred embodiment, this material is nickel, but other like materials can be used, such as palladium. This step is optional but when used it is performed to prevent corrosion products and undesirable reactions with the copper third level metal layer, and the copper aluminum interface between copper third metal layer 23 and the second metal layer 21. In addition the nickel forms an acceptable medium for aluminum bonding, if desired. Typically the third level metal layer will not extend to the bond pads, but in some alternative embodiments it could extend to the bond pads. If used, the nickel coating is plated to a thickness of about 1 micron using conventional techniques. The nickel coating covers the top and may or may not cover the sides of the copper conductor, depending on the process.

The copper third level metal layer 23 of FIGS. 1 and 4 is shown in physical contact with the second layer and at least partially overlying it. That is, the copper third level metal layer is formed everywhere the second level metal is formed and in physical contact with it. Alternatively, if desired, the protective overcoat may be formed over the entire second layer metal level 21 between the second metal and the TI-W and copper seed layers, and the third level metal may be selectively coupled to the second level periodically using vias through this protective overcoat to the second metal layer.

Figure 5:
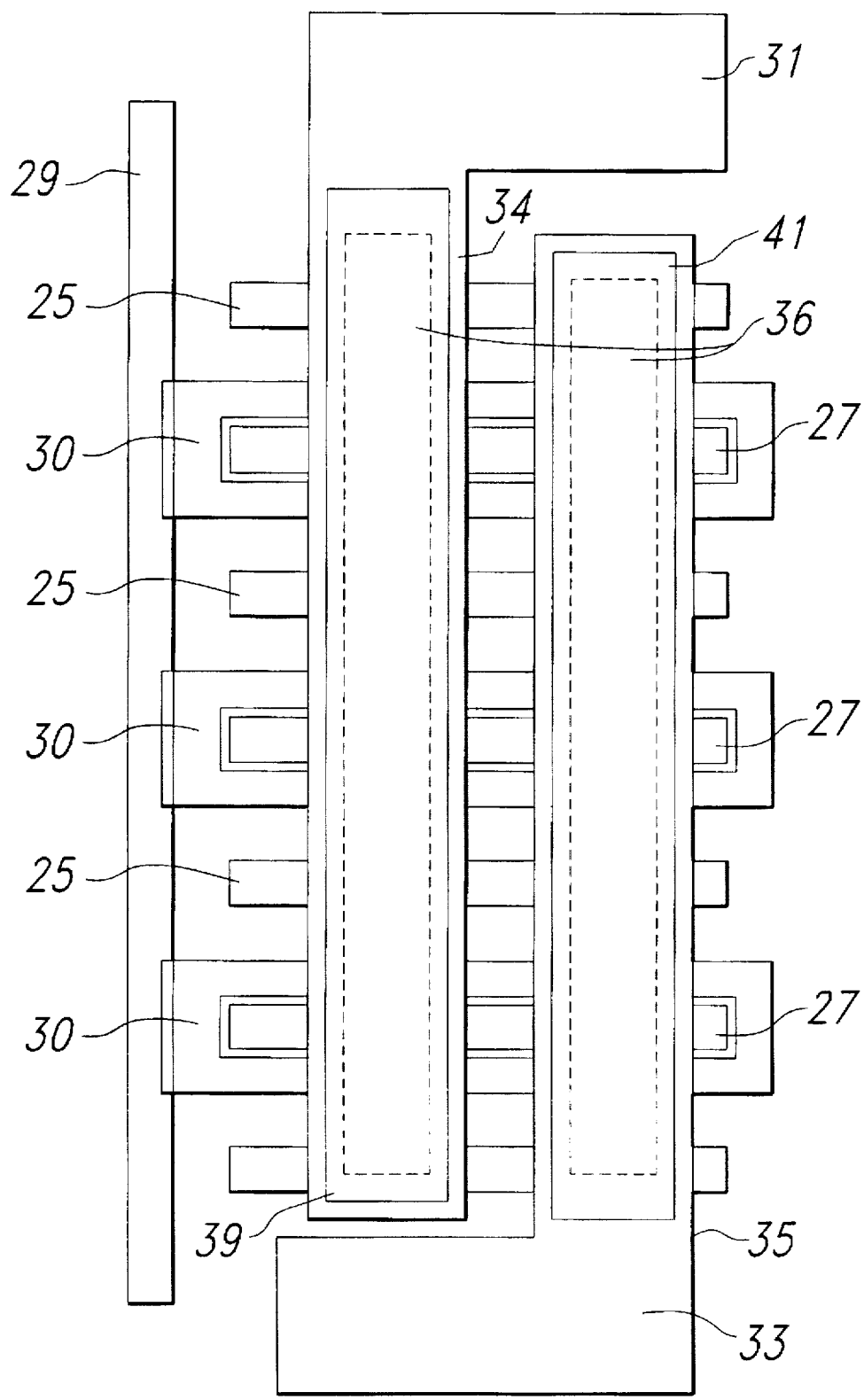
FIG. 5 depicts a plan view of an LDMOS transistor using striped diffusion sections as shown in FIG. 1 and a first preferred embodiment of the invention.

FIG. 5 depicts a plan view of a portion of a transistor fabricated using a plurality of the LDMOS stripes as shown in cross section in FIGS. 1–4. A plurality of drain diffusion stripes 25 are shown alternating with a plurality of source diffusions 27. Gate polysilicon regions 30 are shown running in parallel with and between the source and drain diffusions. Gate connect bus 29 is shown coupling the gate polysilicon regions 30 together to form the gate for a single LDMOS transistor. Source pad 31 is shown at one end of the column of diffusion stripes. Drain pad 33 is shown at the other end of the column of diffusion stripes.

The second level metal layer is used to form source and drain bus conductors 34 and 35. Where a source bus is desired, the second level metal layer source bus 34 is coupled through selective vias, not shown in the figure, to the first metal stripes which are in contact with the source regions 27. Similarly, the drain bus is formed by selectively coupling drain regions 25 by running the second level metal layer drain bus 35 perpendicularly to the first level metal stripes, and selectively coupling the second level metal bus 35 to the first metal drain stripes 25 using vias which are not visible in the figure. Finally, third metal shorting bus regions 39 and 41 are deposited over the second level metal source and drain bus regions, third level metal region 39 overlying and in physical contact through vias 36 with the source bus 34, and third level metal region 41 overlying and in physical contact with the drain bus 35 through vias 36. Note that in the preferred embodiment, the third level metal of thick copper is used to short the second level metal busses together, and is not used over the bond pads. This allows the use of conventional bonding techniques, while still greatly lowering the overall resistance of the device.

In operation, the distribution of current through the first and second level metal layers of the LDMOS transistor formed by coupling the striped diffusions together in FIG. 5 is critically effected by the number of contacts and vias used, and their spacing. A technique to optimize the contact and via placements for the first and second level metal layers has been disclosed in co-pending patent application titled "A Method for Current Ballasting and Busing Over Active Device Area Using a Multilevel Conductor Process", U.S. patent Ser. No. 07/850,601, filed Mar. 13, 1992, TI No. TI-16545, and assigned to Texas Instruments Incorporated. The technique of TI-16545 may be used with the thick third level metal interconnection technique used here, although other methods of coupling the first and second layers are also compatible with the thick third level metal of the preferred embodiment described here. The thick third level shorting bus regions of FIG. 5 greatly reduces the on resistance Rdson of the transistor, and also contributes to a uniform operation of the device may reducing debiasing across the busses of the device.

In operation, the LDMOS transistor of FIGS. 1–4 will receive current through it from the second level metal, which is coupled to the bond wires of the device at the bond pads. The incoming current will see a structure with very low resistance because the copper third level metal shorting bus is an excellent conductor and is of a significant thickness. Current will then be carried across the device and will flow into the second level metal and into the first level metal stripes, where it will flow into the source diffusions. Assuming the gate conductors are on, that is the gate terminals have a positive potential greater than the threshold voltages, the current will flow out of the source regions, across the gate regions, and into the drain diffusions. Again, the current will see a low resistance structure coming out of the drains, as the copper third level metal shorting bus is a significant part of the path from the drain diffusions to the second metal bond pad and then to the bond wire for the drain.

Figure 6:
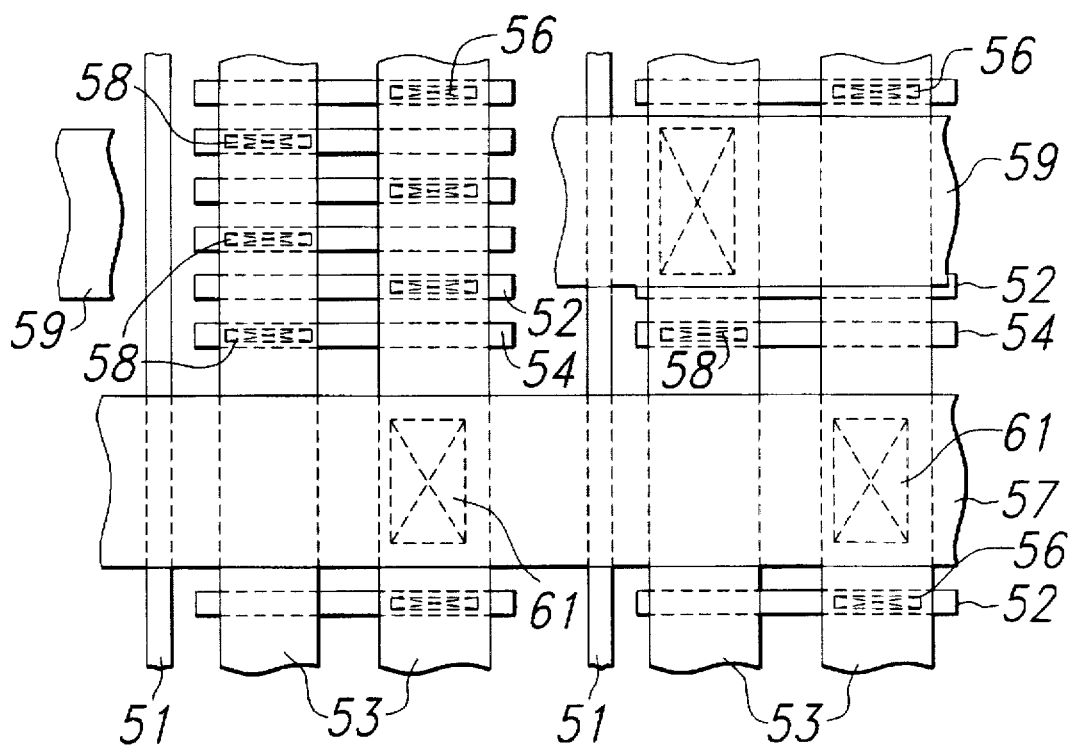
FIG. 6 depicts a plan view of an LDMOS transistor using the striped diffusion sections as shown in FIG. 1 and a second preferred embodiment of the invention.

An alternative embodiment to the arrangement of FIG. 5 is shown in FIG. 6. Again, source diffusions 54 are formed in rows that alternate with the drain diffusions 52. A first level metal layer is formed over and coupled to the source and drain diffusions to form first level metal source and drain stripes. The second level metal busses are run perpendicular to and over the first level stripes, so that a source bus 53 and a drain bus 55 each run over and each partially cover each source or drain striped region. Again, the source and drain regions 54 and 52 are selectively coupled to the second level source and drain busses 53 and 55 using vias 58 and 56 from metal one up to metal two. There are a plurality of these source and drain busses 53 and 55 which alternate and form columns across the device. Each column also has an associated polysilicon gate bus 51 running along side the source and drain busses, and coupled to polysilicon gates between the drain and source stripes that are partially overlying the source diffusions, but are not shown in FIG. 9 for clarity. The third level metal shorting busses 59 and 57 are deposited over the second level metal busses as before, however now the third level metal is running perpendicular to the second level metal busses, and therefore in parallel with the diffusion rows and first metal stripes. These third level metal busses selectively via down to the columns of second level metal to form large source or drain shorting busses. Third level metal bus 59 is coupled to the source columns 53 by vias 63. This bus is shown cutaway over the column at the left hand side of FIG. 9 so that the source and drain diffusions and the second level to first level metal vias 58 and 56 can be shown, but 59 is a continuous bus that runs all of the columns. Similarly, third level bus 57 is coupled to the drain columns of second metal 55 by vias 61. This structure is used for forming very large devices with many hundreds of striped regions coupled together. In forming these devices, it is important that the third level metal be isolated from the second level, usually by a protective overcoat layer, and that the third level metal is perpendicular to the second level of metal and preferably parallel to the first level metal stripes. If additional levels are used, each alternating level should be perpendicular to the levels just above and just below it.

Other embodiments where the copper is used to lower the resistance of all or part of the interconnect structure for a lateral device are also contemplated. The thick third level metal shorting busses may be laid directly on the conventional second level metal, and in electrical and physical contact with it, alternatively the copper may be isolated by protective overcoat or oxide layers, and be coupled to the conventional second level metal by means of selectively cutting vias through the isolation layer and forming vias to the second level metal layer as shown in FIGS. 5 and 6.

The significance of the three level metal interconnection system of the preferred embodiment may be better understood by considering how current debiasing effects occur in the prior art lateral transistors and in lateral transistors using the preferred embodiment of the invention. The metal interconnections used in a power device fabricated using multiple diffusions coupled together contributes a significant amount to the resistance of the device, to current debiasing and to changes in the uniform operation of the device. The metal interconnections also adversely increase the critical performance parameter, Rdson. Using circuit modeling techniques, it has been determined that for an LDMOS transistor having a conventional two level metallization interconnect scheme, the metallization contributes as much as 63% of the overall on resistance of the device for devices of less than 100 milliohms of resistance. In contrast, a model of a transistor using the preferred embodiment of the invention disclosed herein and depicted in FIG. 5 has been calculated to reduce the metal contribution to the device Rdson resistance to 15% of the overall Rdson resistance. Further improvements are seen in the uniformity of operation of the transistor. The critical voltage, Vds, should be uniform along the length of each stripe, eliminating the problems caused by nonuniform switching in the prior art devices.

Figure 7:
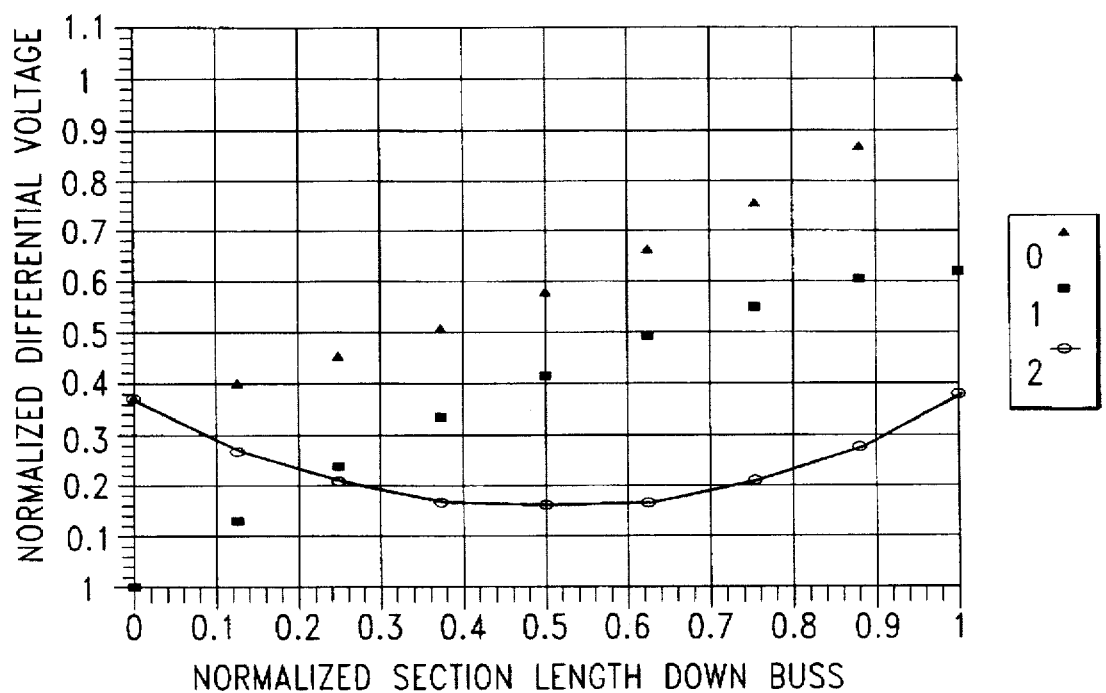

FIGS. 7-10 depict the advantages of the invention using modeling results for an exemplary LDMOS transistor structure. The LDMOS transistor considered here comprises 200 striped diffusions similar to those depicted in FIG. 8. The pads are located at the ends of the column of striped diffusions. The stripes are 400 microns in length. FIG. 7 depicts the voltage potential variations predicted along the second metal buss length using a conventional two level metal system with 3 micron aluminum used as the second level metal layer to connect the 200 striped geometry diffusions together.

In FIG. 7, the voltage differential is shown normalized to 1.0. Likewise, the distance along the second metal buss length is normalized to 1.0. Ideally, the drain voltage Vd would be 1.0 at all points along the buss. The source voltage Vs would be 0.0, and the Vds would ideally also be 1.0. FIG. 7 depicts the results of the modeling simulation, assuming a typical silicon specific resistance Rsp of 0.82 milliohms× cm². The curve marked out by rectangular points depicts the potential Vs at the source, along the length of the bus. The rise in source voltage along the length of the bus is due to the current debiasing which occurs as the current flows down the metal bus to the contacted location. The curve plotted with triangular points depicts the drain voltage Vd along the bus length. The drain region demonstrates the same debiasing phenomenon as the source region, but instead of rising above zero, the drain region debiasing results in a voltage drop Vd below the applied potential from the current flow in the bus. The curve in FIG. 7 marked with circles depicts the differential drain to source voltage, Vds, along the bus. Ideally, Vds would be the difference between the applied potentials at the contact points, that is 1.0, along the length of the bus. FIG. 7 depicts the result of debiasing in a two level interconnect system on Vds. The voltage Vds starts at either end of the bus far lower than is desired, and in the middle of the bus it falls even farther. The result will be a device with much poorer performance than desired, or expected.

FIG. 7 illustrates that in a large LDMOS device constructed from multiple striped geometries connected together, a huge debiasing effect occurs along the bus length. A major loss in performance is experienced from the metal resistance added by the metal interconnection scheme and also the lowered drive voltage Vgs that results from the debiasing rise in the source voltage along the bus length.

FIG. 8 depicts, for contrast, the debiasing effect predicted by the same electrical model if only a single diffusion stripe of 400 microns in length were tied to the shorting bus. This structure can only be used for a small transistor. Again, only first and second metallization layers of conventional materials and thicknesses are used. The triangular curve shown in FIG. 8 depicts the drain voltage as measured along the buss length. Clearly, no significant debiasing occurs, as the curve for the drain voltage approaches the ideal, that is the entire length of the bus the drain region is at the potential applied at the contact point, here shown normalized to 1.0. Also, the source voltage Vs is plotted as the curve shown with rectangular data points. Again, no debiasing occurs, and the source voltage also retains a flat, almost ideal shape, and remains at the 0 level along its entire length. Since both the drain and source voltages show no debiasing, the differential voltage Vds can be expected to remain ideal as well, and remains at the 1.0 level as shown by the curve plotted using the circular data points in FIG. 8. Comparing FIGS. 7 and 8, it can be seen that when large structures are designed using the conventional two level metal interconnection structures of the prior art, significant ill effects occur due to the debiasing and the resistance of these structures. For small structures using a single stripe, no debiasing effects occurs. The interconnection structure of the prior art therefore causes debiasing, higher resistance and a significant loss of performance for the larger devices.

FIG. 9 depicts the results and advantages obtained using the invention in a preferred embodiment. Now the three level metal system of the preferred embodiment depicted in FIGS. 1-6 is used. Two hundred diffusion stripes, each 400 microns long are formed, and over the conventional first and second level metal layers, a third level of 25 micron thick copper is used to connect the source and drain regions. Again the drain voltage is plotted as a curve using triangular data points, normalized to 1.0. At the contact point the voltage is 1.0, and as the data is collected along the bus from the right edge of the graph to the left, some debiasing does occur. However, in contrast to FIG. 8, the level of debiasing is greatly reduced and is limited to just over 100 millivolts at the farthest point from the drain potential contact point. Similarly, the curve using the rectangles illustrates the source potential Vs along the length of the bus. At the contact point the source is at a normalized potential of zero, and rises as the data is collected along the length of the bus. But at the farthest point, the right side of the plot, the source voltage is only 110 millivolts above the desired potential. The differential voltage Vds is kept close to ideal by the lack of debiasing, and at its lowest point, in the middle of the bus, it drops about 180 millivolts. This is in contrast to the very low Vds obtained using the prior art techniques, as shown in FIG. 7.

FIG. 10 is a table that further illustrates the significance of the use of the preferred embodiment in reducing the active on resistance and the debiasing effects. In FIG. 10 Column A shows the results obtained in the resistance measurements for the device of FIG. 7, using first and second metal layers only, and 200 stripes each 400 microns in length. Column B shows the results of a single 400 micron stripe for comparison, the device simulated in FIG. 8, and illustrates the amount of resistance contributed by the need to interconnect the stripes with metal to obtain larger devices. Column C in the table of FIG. 10 illustrates the advantages of the preferred embodiment. Now the third level of thick copper is added to the conventional metallization scheme, greatly reducing the resistance obtained for the device with 200 stripes.

A physical analysis can also be done that will give an idea of the expected performance of the striped device. The silicon specific on resistance Rsp=0.82 milliohm×cm². Therefore, the expected on resistance should be the specific on resistance of the device over the active area AA, or:

$$\frac{Rsp}{AA}.$$

However, the electrical model illustrated in column A of FIG. 10 indicates that for a 200 stripe LDMOS device using conventional metal techniques to interconnect the devices, the equivalent circuit obtained using the model indicates that because of the effects of debiasing, the actual resistance Ron in the active area is Ractrl=0.2626 ohms, which is four times the expected on resistance. Further, the model indicates that 75.6% of this resistance is due to the metal for interconnecting this structure. Thus the debiasing effect causes the actual resistance in the active area to be about 4 times the expected on resistance.

FIG. 10 in column B also indicates that for a single stripe device, requiring no metal interconnect, there is no debiasing effect. The Vd, Vs and Vds profiles of FIG. 8 present an ideal case for a small device, which is reflected in the Ron obtained in column B of FIG. 10.

The use of the invention in the striped device makes it possible to approach the ideal case for the 200 stripe LDMOS device. The third column, column C, of the table of FIG. 10 shows the advantage of the use of the invention. FIG. 10 in column C shows that the use of the copper third level metal shorting busses coupled to the second level metal gives a real resistance of 0.0771 ohms, much closer to the ideal case of column B, and that the contribution of the metal interconnect to the resistance Ron is now only 16.9%.

FIGS. 11–14 depict, in a series of plan views, the metallization interconnect pattern from second metal through the third metal layer for a seven transistor circuit using the preferred embodiment shown above in FIGS. 1–5. The preferred embodiment described above shows a transistor fabricated having third level metal overlying large bussing regions but not over the bond pad regions. The use of conventional second level metal to form the bond pad regions is advantageous because conventional bonding systems are sufficiently low in resistance, and are cheaper than bonding to the thick third level metal, which requires additional nickel plating of the third level metal. However, the lower resistance is still required in the large bussing regions of the device to address the debiasing problems described above. By using the copper buss bars outside the bond pads, a device with a desired Rdson resistance may be made in an area two to three times smaller than would be required using the conventional two level metallization structures of the prior art. The smaller area requirement allows multiple devices to be fabricated on a single IC.

FIGS. 11–14 illustrate in plan views the metallization pattern for an example seven transistor IC using lateral DMOS devices. The advantages of the invention enable the production of this IC by enabling a single LDMOS power transistor of a desired performance characteristic to be fabricated in a small enough area of silicon that several such devices can be fabricated on a single IC. Without the third level of thick copper coupling the diffusions of the devices together, and thus lowering the area required for each device, this level of integration would not be possible.

Figure 14:
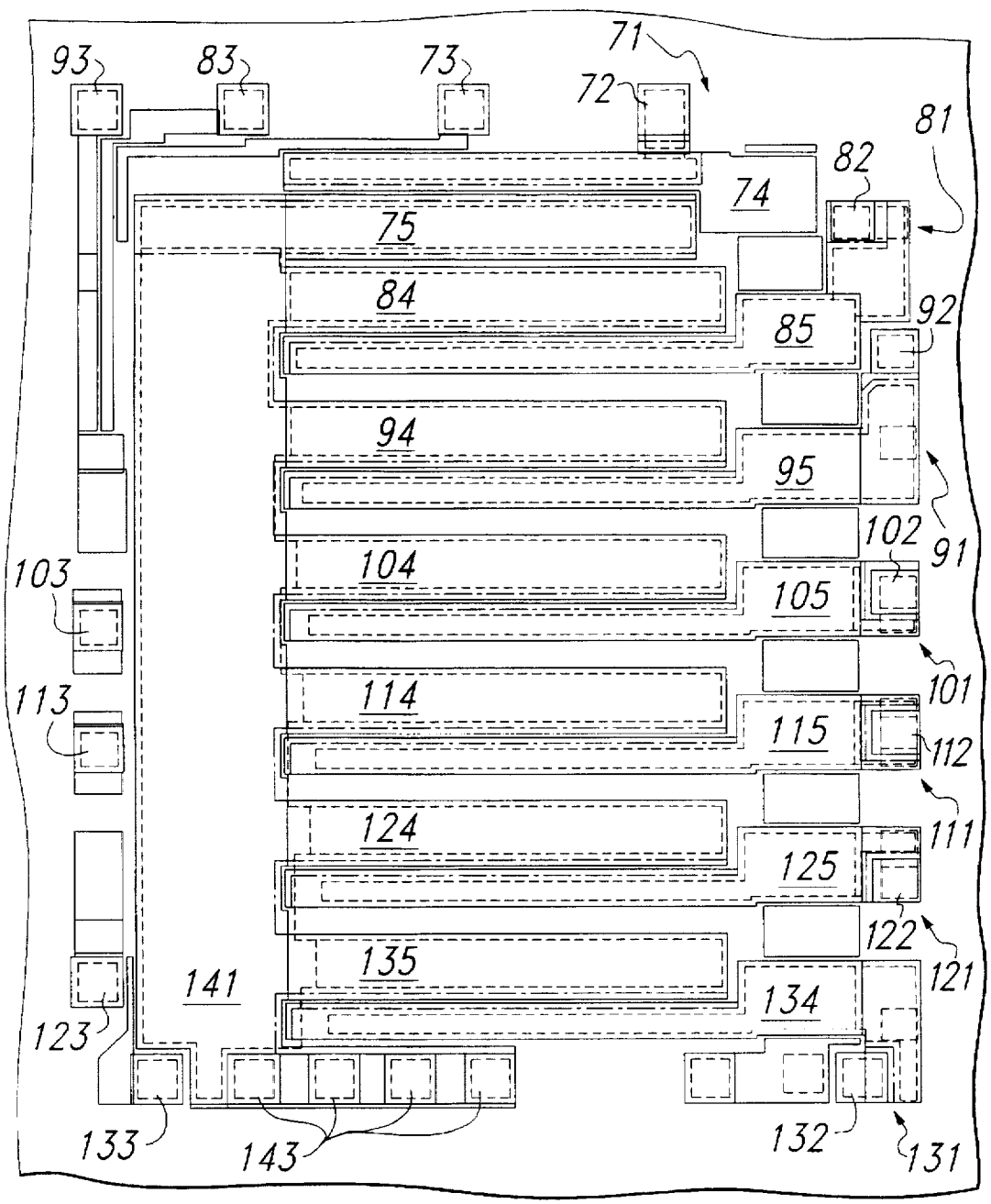

FIG. 14 depicts the metallization pattern for the second level of metal for a seven transistor integrated circuit. The sources of each of the seven transistors 71, 81, 91, 101, 111, 121, and 131 are coupled together using common source bus 141. The gate connections are made at gate pads 73, 83, 93, 103, 113, 123 and 133, one for each of the seven transistors. The drain connections are made at drain pads 72, 82, 92, 102, 112, 122, and 132, one for each of the seven transistors.

Each transistor 71, 81, 91, 101, 11, 121 and 131 is produced using the striped source and drain diffusion scheme of FIG. 8. The second level metal is used to interconnect the first level of metal, which is not shown here for clarity. The first level metal forms rows of stripes which are underneath the second metal and therefore not visible. The first level metal stripes are perpendicular to the second level metal columns. The second level metal forms columns of alternating source and drain busses, one source and one drain bus for each of the transistors. For example, transistor 71 has source bus 72 and drain bus 74. As shown in FIG. 5, the source bus and the drain bus each cover part of each of the striped regions of the transistor. Using vias which are also not shown in FIG. 11, the source bus selectively couples the source diffusions together by coupling the striped first metal layer regions covering the source diffusions together. Similarly, the drain bus selectively couples the drain diffusions together. Each source/drain pair of columns in FIG. 11 therefore forms a single LDMOS transistor. Transistor 81 has a source column 84, and a drain column 85. Transistor 91 has a source column 94, and a drain column 95. Transistor 101 has a source column 104 and a drain column 105. Transistors 111, 121 and 131 are similarly constructed. The drain column for each of the transistors is coupled to the drain pad. The source columns are all coupled to the source common bus 141 and to source pads 143. Gate polysilicon rims parallel to the source and drain columns and there is a gate polysilicon column associated with and running between each transistor. The gate polysilicon columns are coupled to the respective gate pads.

Figure 11:
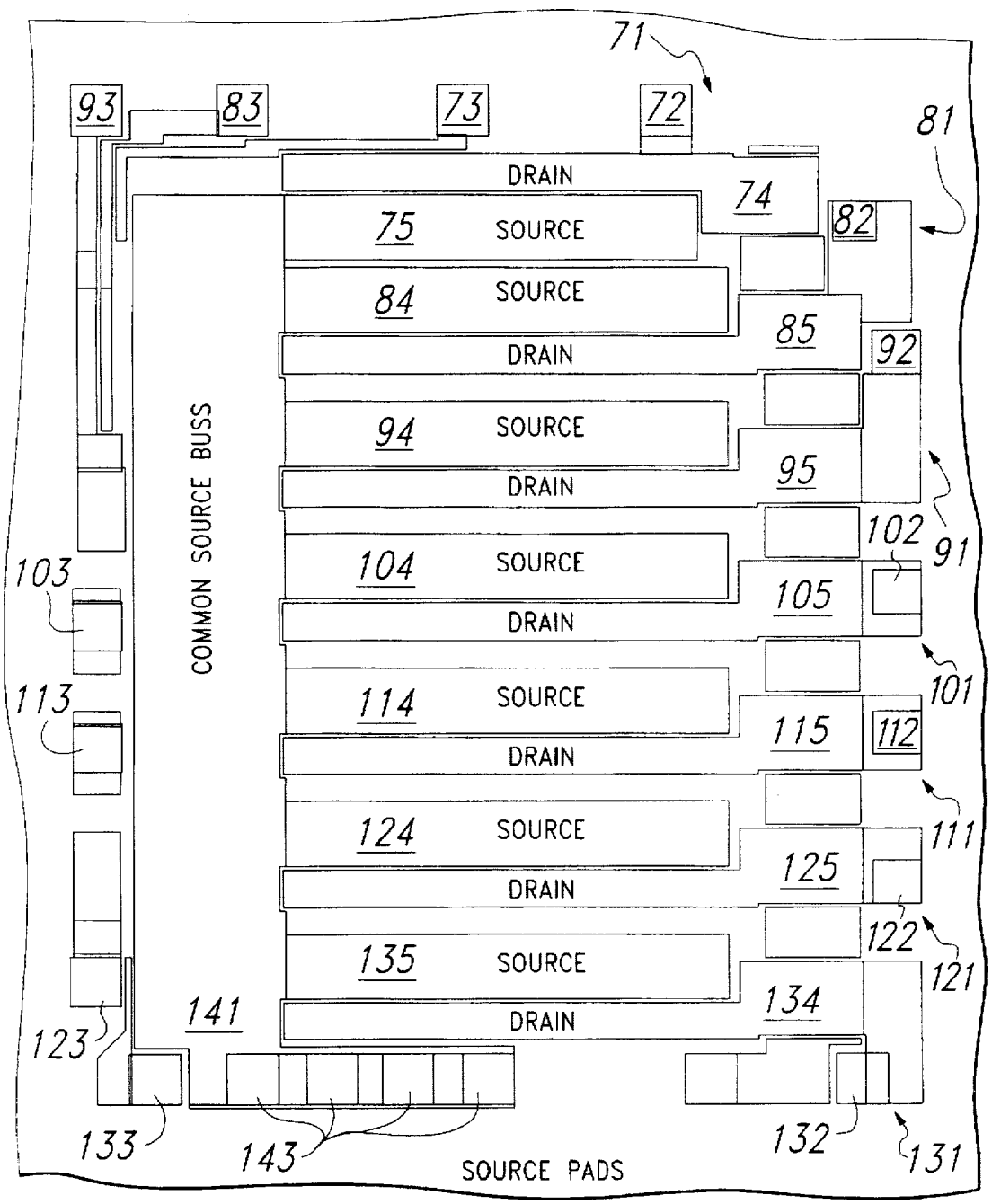
FIGS. 11–14 depict a plan view for the different metallization layers for producing a multiple transistor integrated circuit using a second preferred embodiment of the invention.
Figure 12:
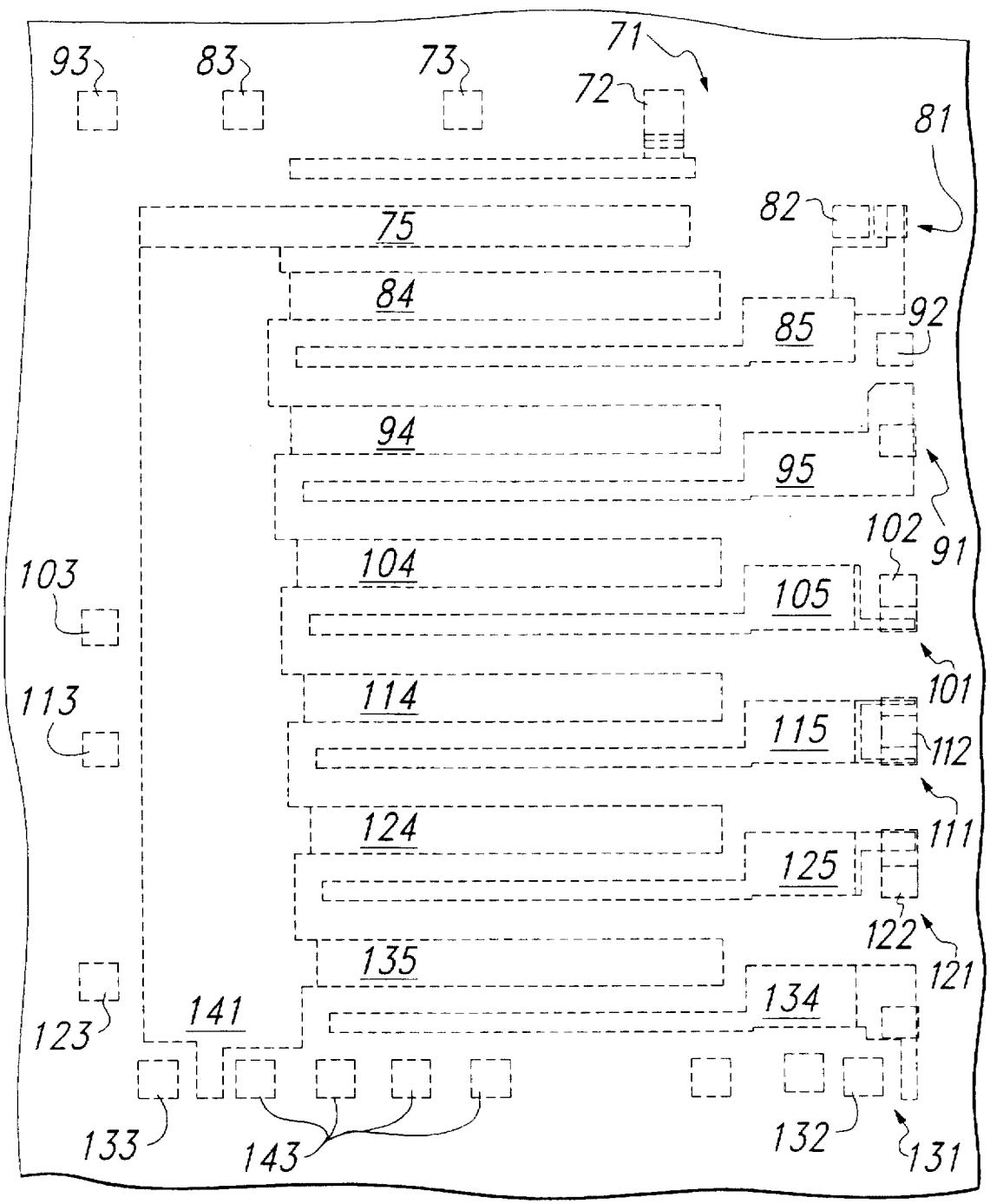

FIG. 12 depicts the mask used to form the vias between the second level of metal as shown in FIG. 11 and the third level of thick metal, not yet shown. The via pattern shown in FIG. 12 indicates where the protective overcoat coveting the second level of metal will be opened and covered with the third level of metal to form the final interconnected IC. The bond pads are also shown as having vias in the protective overcoat, however these areas will be bonded to using conventional ball bonding techniques, so there will be no metal three copper plated onto those areas. In FIG. 12, vias are shown formed over each gate bond pad 73, 83, 93, 103, 113, 123, and 133, each drain bond pad 72, 82, 92, 102, 112, 122 and 132, and over the source pads 143. Also, vias are formed over the source common bus 141, over the source columns 75, 84, 94, 104, 114, 124 and 135, and over the drain columns 74, 85, 95, 105, 115, 125 and 134.

Figure 13:
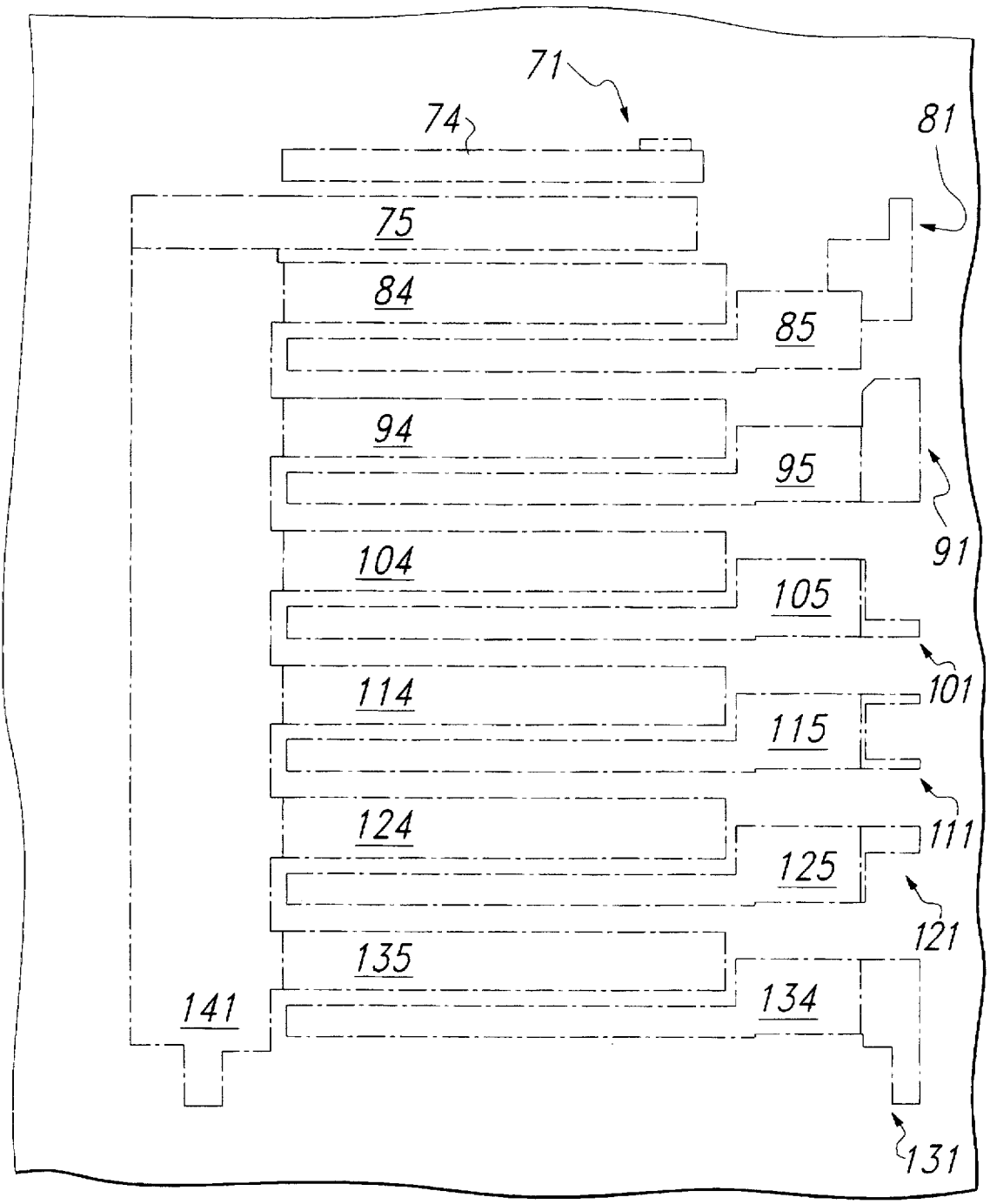

FIG. 13 depicts the mask used to pattern the areas to receive the copper plating for the third level of metal. The common source bus 141, the source columns, the drain columns, and the drain contacting areas, but not the bond pads, will all be covered with the third level of metal, which will be in physical and electrical contact with the second level of metal shown in FIG. 11 through the vias as shown in FIG. 12. All regions of FIG. 13 are numbered identically to FIGS. 11 and 12.

FIG. 14 depicts the composite of FIGS. 11, 12 and 13. The numbering of FIG. 14 is identical to that of FIGS. 11, 12 and 13. The bond pads are shown as having second level metal, covered with vias in the protective overcoat opening a hole for the bonding operations in the pad areas themselves, and no third metal is on the bond pads. The common source bus 141 shows a third metal area over it with an underlying via shown coupling it to a hidden metal two source bus. Each of the source columns is shown as a metal three region with an underlying via coupling it to a metal two region, which is hidden underneath, all of the source columns running into the common source bus. Similarly, each of the drain regions is shown as a contacting area and a columns of metal three with a via regions lying underneath it coupling it to a metal two drain column which is not visible in the figure. A cross section of the completed device taken along one of the source columns will be identical to that shown in FIG. 4.

Figure 15:
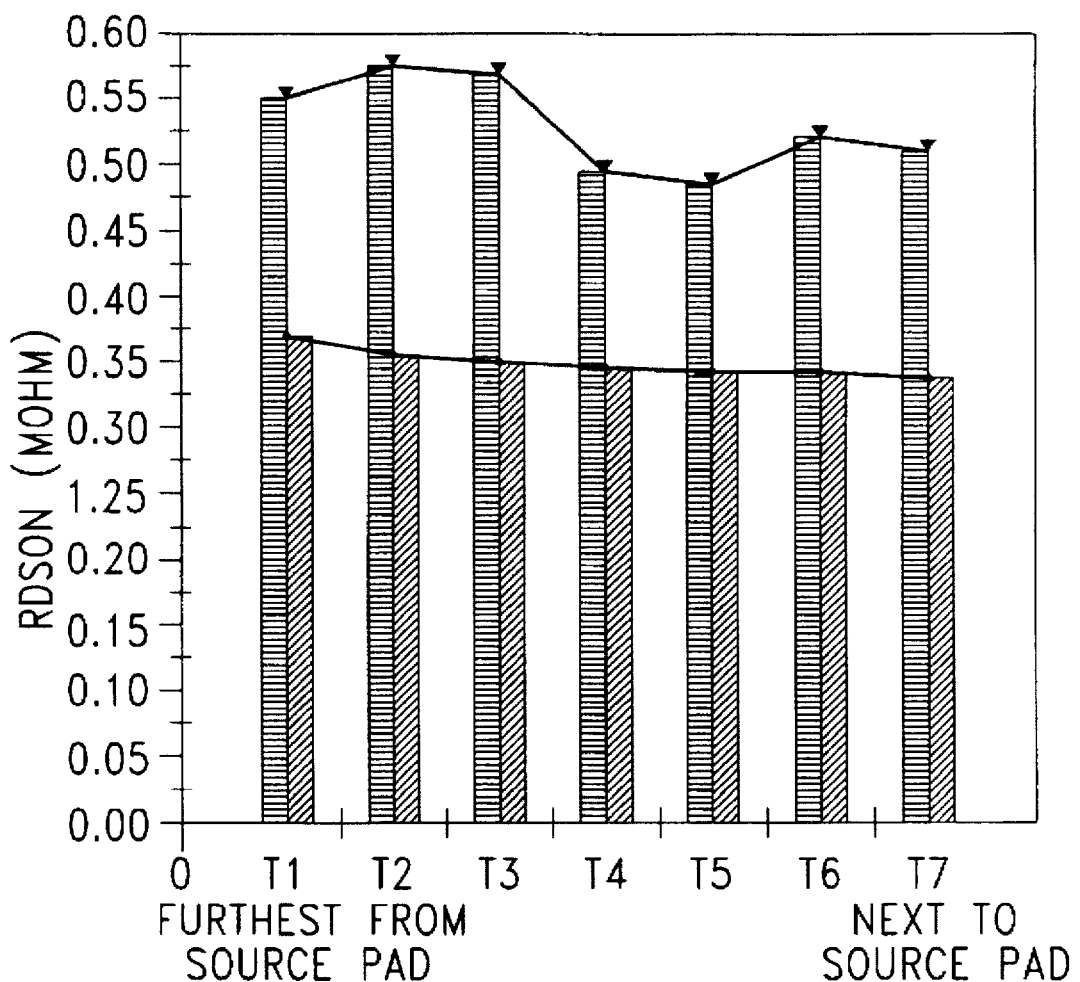
FIG. 15 depicts a plot comparing the Rdson resistance of a transistor of the embodiment of FIGS. 14–17 and contrasting the Rdson resulting from the advantageous use of the invention to the Rdson resistance of a similar device fabricated using conventional layout techniques of the prior art.

FIG. 15 is a plot of the results achieved for the seven transistor integrated circuit design using real data, and comparing the two level metal interconnection scheme of the prior art to the three level metal structure of the preferred embodiment as shown in FIGS. 11–14. The measured actual resistance Ron is plotted for each of the seven transistors T1–T7, corresponding to transistors 71, 81, 91, 101, 111, 121 and 131 in FIGS. 14–17. The top curve, labeled "a", and using small triangles as data points, is for a seven transistor IC using the two level metallization techniques of the prior art. The bottom curve, labeled "b", and using round circles as data points, is for the seven transistor IC of the preferred embodiment incorporating 35 micron thick third level metal as shorting busses, as shown in FIGS. 11–14.

The designed-for Ron expected for the part is about 350 milliohms, based on its active area. However, actual measured results using the two layer metal conventional interconnection scheme of the prior art result in a measured Ron of a range of about 480–570 milliohms. FIG. 15 depicts the results as a function of the distance from the pads. Each transistor's individual Ron is shown. The ideal Ron plot would be flat across the seven transistors. In the prior art curve, labeled "a", it can be seen that as the transistor location varies, the Rdson varies, showing a significant debiasing effect. With the conventional metallization interconnect scheme, the Ron increases and the variance across the part is due to current debiasing, which also decreases the Vgs of the transistor and results in a lower drive and thus a lower safe operating area rating.

In contrast, the second curve plotted in FIG. 15 depicts the measured results obtained when thick copper third level metal layer is added, overlying the source bus and the drain busses over the columns of second level metal. This third layer of thick level metal provides a great reduction in the overall resistance of the metallization structure seen from the pads, which results in lower overall Ron and improved performance. This is shown by the flatter curve for Ron for the preferred embodiment as measured and plotted in FIG. 15. Because there is less debiasing and less variance from transistor to transistor, the gate to source voltage Vgs remains more ideal, drive for the transistor remains high, and a higher safe operating area rating is obtained for the same silicon area because of the uniformity of operation of the device.

In FIG. 15 the transistor T1 is farthest from the source pad 143 and in general, because of source buss debiasing, the transistor farthest from the source pads will have the highest active on resistance Ron. The locations of the transistor T1 and the source pads 143 can be seen best in FIGS. 11–14. The plot depicted in FIG. 15 not only shows that the Ron obtained for T1 using the conventional prior art two level metallization scheme is higher than the Ron obtained using the three level thick metal copper scheme of the preferred embodiment, but FIG. 15 also shows that the distribution of Ron obtained from transistor T7 to transistor T1 is very poor in the conventional two level metal case, with a variance of 90 milliohms. In contrast, the plot for the transistors T1–T7 using the preferred embodiment shows Ron for each of the seven transistors fabricated using the three level metal with the thick copper third level to be about 350 milliohms, with a fairly flat distribution. This results in an integrated circuit having a plurality of power transistors with uniform operation. If the user connects the transistors to form a circuit, such as an H bridge, each of the devices will operate uniformly providing excellent overall circuit performance.

The exemplary LDMOS devices described above provide an excellent application for the invention described herein. Other laterally formed devices are also compatible with the third level metal shorting busses of the invention. For example, a lateral zener diode may be formed and used as an ESD protection circuit. The zener diode has p and n diffusions formed in diffusion wells, the p and n diffusions alternating and forming stripes of anode and cathode material. These striped regions are then each covered with first metal material and coupled together using a metallization scheme similar to the LDMOS transistors above. The second metal busses are used to couple the anode and cathode regions together and to the other diodes.

Figure 16:
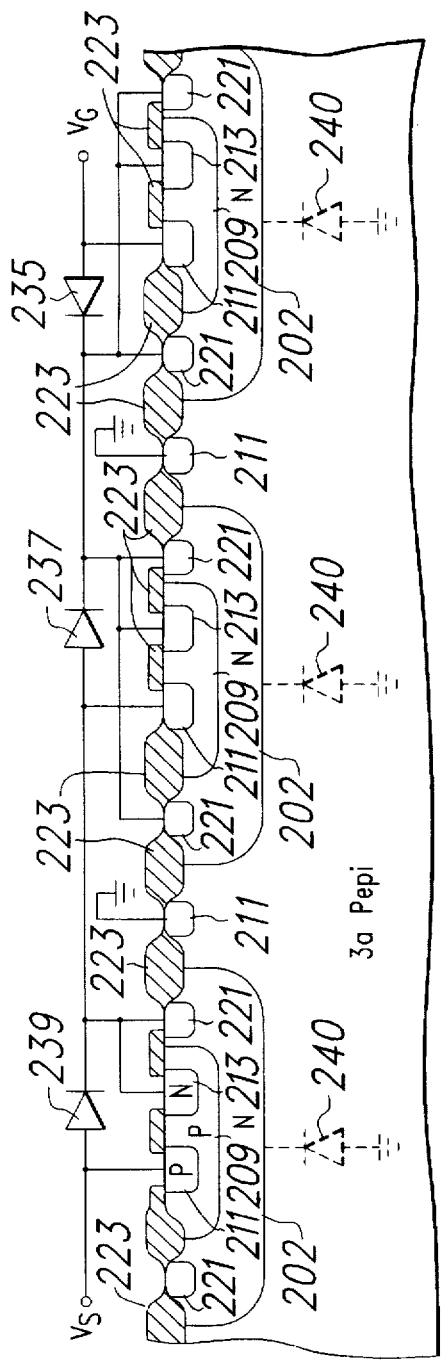
FIG. 16 depicts a cross sectional and schematic view of a three diode ESD protection circuit incorporating the thick metal interconnect of the invention.

As for the LDMOS transistor case, the resistance of the diodes used for ESD protection is critical to device performance. FIG. 16 depicts a combined cross section and schematic view of a stacked diode ESD protection circuit which protects the active circuitry of an IC from ESD strikes by breaking down zener diodes 235, 237 and 239. The active circuitry will typically be LDMOS or MOS transistors which have thin gate oxides and parasitics that are susceptible to breakdown when high voltages are applied. The three diode stack is coupled to the gate terminal Vg of the devices to be protected. If the overall resistance of the diodes forming the protection circuitry is high, the breakdown time is increased. This time is similar to a switching speed for a transistor. The breakdown speed is inversely related to the diode junction capacitance and the resistance. As the resistance is lowered, the breakdown speed is enhanced and the protection offered by the ESD diode stack 235, 237 and 239 of FIG. 16 improves, because it is much less likely that the active circuitry will be damaged before the zener stack breaks down and routes the electrostatic discharge strike current away from the active circuitry.

FIG. 16 depicts, in cross section, an exemplary three diode stack to be used in the protection circuitry of FIG. 16. Each diode 235, 237 and 239 is a lateral diode which is formed in a manner that is compatible with LDMOS processing. The diffusion wells 209 are formed by a first diffusion step into the epitaxial layers 203, and the diodes are formed of alternating stripes of cathode 213 and anode 211 material in a second diffusion step. Although in FIG. 16 each diode is shown with only a single cathode stripe and a single anode striped diffusion, this is done for clarity only. Each diode has multiple alternating cathode and anode diffusion stripes 213 and 211 diffused into the p diffusion wells 209. Each diode is isolated by the use of a N tank 202 formed underneath the p diffusion wells. Parasitic diodes 240 are used to prevent pnp lateral bipolar parasitics from becoming active and conducting unwanted current.

In operation, when an ESD voltage strike appears at the gate input Vg, the diodes 237 and 239 are reverse biased. If the voltage strike exceeds the combined breakdown voltage of the diodes 237 and 239, the diodes will go into zener breakdown. More diodes can be added if needed to protect the thin gate oxides of a particular device. In a typical application for the circuit of FIG. 16, the LDMOS transistor being protected has a gate oxide rupture voltage of about 30 volts. Using an existing LDMOS process, the zener diodes breakdown between 8 and 9 volts, and a forward biased voltage drop of about 0.7 volts. The zeners must not breakdown for normal input voltages, and for this application the maximum normal input voltage is about 15 volts, so the three diode configuration is used. The breakdown voltage, which is the combination of the zener breakdown voltages plus a forward biased diode drop, is 16–19 volts, which exceeds the normal operating voltage but is less than the gate oxide rupture voltage. For an ESD strike at the gate input, diode 235 will be forward biased, and the gate input will be voltage clamped to the voltage of the diode stack. This clamping action will prevent damage to the gate oxides of the active circuitry. Diode 235 is reverse biased when the gate terminal Vg goes negative, and operates in the same manner to prevent a negative strike from harming the gate oxides of the active circuitry.

Figure 17:
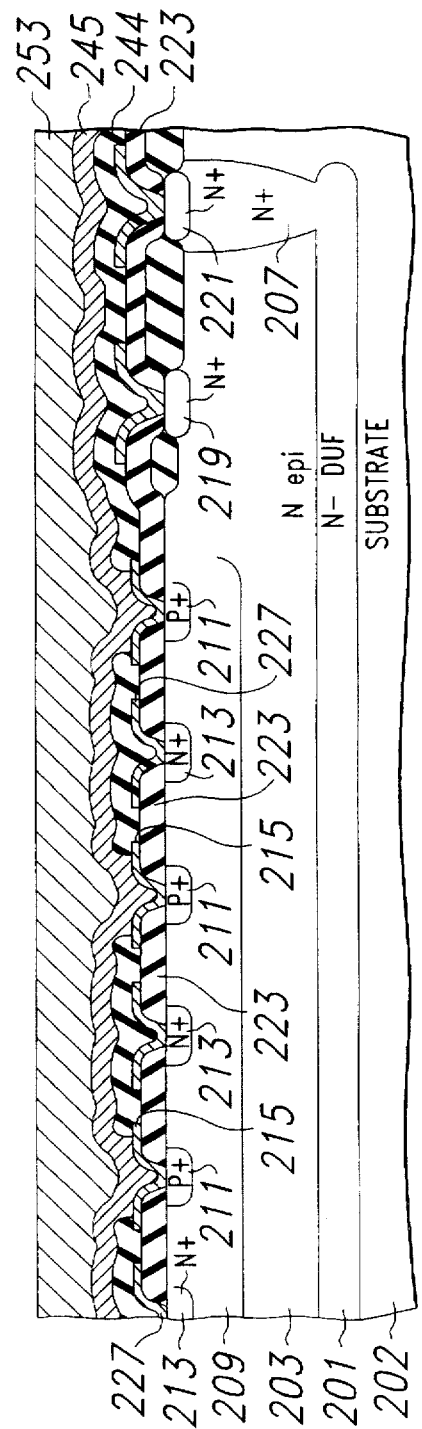
FIG. 17 depicts a detailed cross section of one of the three diodes of the ESD protection circuit of FIG. 16.

FIG. 17 depicts, in cross section, a detailed view of one of the diodes of FIG. 16 and depicts the second and third level metallization structure of the preferred embodiment. In FIG. 17, a portion of the p diffusion well 209 is shown with multiple cathode diffusions 213 and multiple anode diffusions 211. N buried layer 201 is formed over substrate 202, as the bottom of an N tank. Deep diffusions 207 and n+ contacting regions 221 complete the tank. First metal stripes 227 contact the cathode diffusions 213. First metal stripes 215 contact the anode regions 211. Oxide 223 isolates the first metal from the diffusions, and vias are patterned over the contacting regions. Oxide 244 is used to isolate the first metal. Vias are patterned in oxide 244 and the second metal layer 245 is formed, contacting the first metal in the anode regions, in this case, so that second metal layer 245 is an anode second metal buss running over the striped regions and perpendicular to them. Third metal shorting bus 253 is a copper bus which is formed as described above. The protective overcoat is formed over the second metal layers and then stripped away where it is desired the third metal layer contact the second metal layer, as in FIG. 17. A barrier layer and the copper seed layer are deposited, photoresist is used to pattern the copper layer and then the thick copper bus 253 is plated onto the seed layer.

Figure 18:
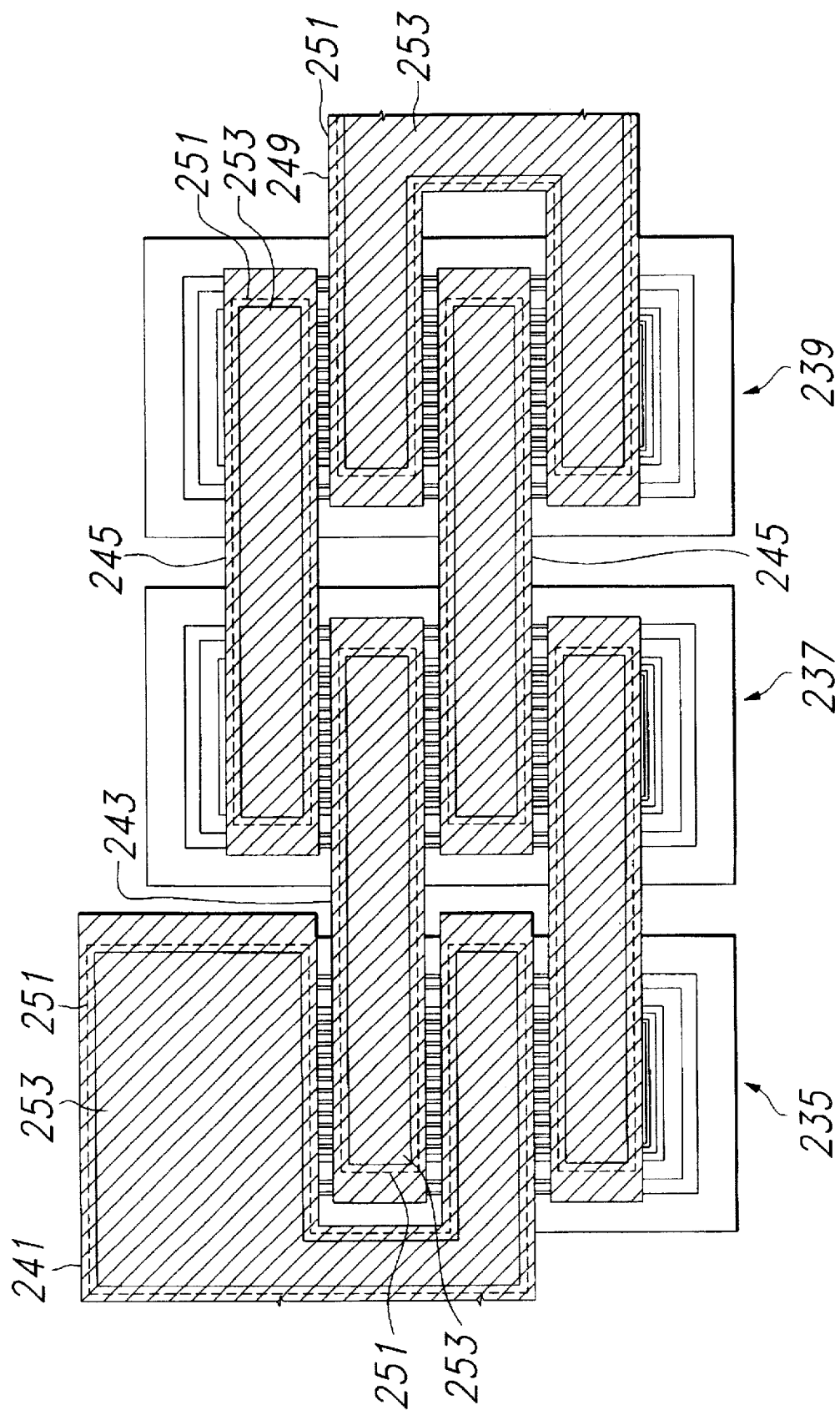
FIG. 18 depicts a plan view of the three diode ESD protection circuit of FIG. 16.

FIG. 18 depicts a plan view of the three diode circuit of FIG. 16 and incorporates the third level thick copper shorting busses of the invention. In FIG. 18, the three diode tanks of FIG. 16 are shown having first metal covering the striped geometry diode cathode and anode diffusions. Second metal busses 43 and 45 couple the cathode and anode regions together by selectively coupling to either anode or cathode striped regions. The individual diode cathodes and anodes are coupled to form the three diode stack of FIG. 16, diodes 235, 237 and 239. A protective overcoat, not visible in the drawing, is formed over the entire structure using conventional techniques. Via regions 251 are formed in the protective overcoat where the third level metal shorting buss is to contact the second level of metal. The third level copper 253 is plated onto these areas in the same manner as described above with respect to the LDMOS transistors and with also described above with respect to FIG. 17.

In operation, the overall resistance of the diode stack of FIG. 18 is greatly reduced and performance is improved over the prior art due to the lowered resistance which results from the use of the third level metal of thick copper. The breakdown speed is increased which enhances the ability of the diodes to protect the active circuits in the case of an ESD strike. A high performance ESD circuit can be fabricated in less area than before because the resistance of the structure including the third level of metal is far less than the resistance obtained using the prior art metallization structures. The third level of thick metal may be used to lower resistance in other circuit devices as well, such as lateral resistors, capacitors, diode connected transistors and capacitor connected transistors, etc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a multiple transistor integrated circuit with a thick metal interconnect structure, comprising the steps of:

providing a plurality of gate bond pads, each for receiving a gate input to a respective LDMOS transistor;

providing a plurality of source bond pads, each for receiving a source input to a respective LDMOS transistor, all coupled together and to a common source buss;

providing a plurality of columns of multiple rows of diffusion regions, said diffusion regions alternating and being of a first and a second conductivity type;

providing first level metal layers placed over and electrically contacting each of said diffusion regions, said first level metal layers forming source stripes and drain stripes;

providing a plurality of columnar second level metal source busses, each coupled to said common source bus and each partially overlying a respective one of said plurality of columns of multiple rows of diffusions, each columnar second level metal source bus being coupled to selected ones of said source stripes;

providing a plurality of columnar second level metal drain busses, each coupled to a respective one of said drain bond pads, each partially overlying a respective one of said plurality of columns of multiple rows of diffusions and each being spaced apart from said plurality of columnar second level source busses, said source and drain busses being alternating columnar busses;

providing a plurality of third level thick metal source shorting busses, each associated with and partially overlying a respective one of said source busses, said third level thick metal source shorting busses not overlying said source bond pads; and providing a plurality of third level thick metal drain shorting busses, each associated with and partially overlying a respective one of said drain busses;

the third level thick metal source and drain shorting busses being in electrical contact with said source and drain busses and lowering the on resistance of the LDMOS transistors on the integrated circuit.

* * * * *